United States Patent [19]

Sakai et al.

[11] Patent Number: 4,707,718
[45] Date of Patent: Nov. 17, 1987

[54] READ-ONLY MEMORY

[75] Inventors: Yoshio Sakai, Hachioji; Ryo Nagai, Koganei; Shuichi Yamamoto, Kokubunji; Hideo Nakamura, Nishitama; Kouki Noguchi, Kokubunji, all of Japan

[73] Assignee: Hitachi, Ltd., Tokyo, Japan

[21] Appl. No.: 635,401

[22] Filed: Jul. 30, 1984

[30] Foreign Application Priority Data

Jul. 29, 1983 [JP] Japan ................................ 58-137537

[51] Int. Cl.$^4$ ........................................... H01L 27/10
[52] U.S. Cl. ........................................ 357/45; 357/40; 357/23.6
[58] Field of Search ........................... 357/23.6, 40, 45

[56] References Cited

U.S. PATENT DOCUMENTS 4,298,962  11/1981  Hamano et al. .................... 357/23.6
4,384,345   5/1983  Mikome ............................. 357/45

Primary Examiner—Martin H. Edlow
Attorney, Agent, or Firm—Antonelli, Terry & Wands

[57] ABSTRACT

A read-only memory which features a high operation speed and a high degree of integration. A first layer works as ground lines and word lines, and a second layer works as data lines. The word lines and the data lines are arranged linearly to reduce parasitic capacitance and parasitic resistance, and hence to achieve high-speed operation. The invention is adapted where data of large quantities are to be treated, without effecting the rewriting.

12 Claims, 11 Drawing Figures

READ-ONLY MEMORY

BACKGROUND OF THE INVENTION

The present invention relates to structure of a read-only-memory (hereinafter referred to as ROM) which operates at high speeds and which has a high degree of integration.

In a ROM employing insulated gate field effect transistors (hereinafter referred to as MOS transistors to represent the case of using an oxide film as an insulator), a single MOS transistor is allotted to one bit of memory. Therefore, the number of elements per bit can be minimized compared to types of memories, to realize a device of a highly integrated form. Further, owing to the orderly layout of the device, design effort for LSI (large scale integration) can be reduced. Therefore, the ROM is frequently used for the logic of highly integrated microcomputers. The LSI can be realized in a highly dense integrated form featuring high-speed operation if the memory cell area constituting the bits of ROM is reduced, if parasitic capacitance is reduced, and if parasitic resistance is reduced.

FIG. 1 shows the circuit structure of a major portion of a general ROM, in which reference numeral 30 denotes a memory cell array, 31 denotes memory cells consisting of MOS elements selectively formed using a mask pattern, 40 denotes data lines, and 50 denotes word lines.

FIGS. 2 and 3 are plan views showing the structures of conventional ROM memory cells. Namely, these drawings show memory cells for four bits. In the conventional structure of FIG. 2, gate electrodes 1 of MOS transistors consisting of polycrystalline silicon are connected together by aluminum lines of the first layer running in a horizontal direction to constitute word lines 2, diffusion layers are connected together by aluminum lines of the second layer running in a vertical direction to constitute ground lines 3 and data lines 4, and a thin oxide region is formed or not formed under the gate electrode 1 as represented by a hatched region 20 in FIG. 2 to write memory information. This is accomplished by changing the photomask of an isolation region 101 (usually by using LOCOS (local oxidation of silicon)). In the ROM of FIG. 2, the word lines and data lines are formed by aluminum lines having a small wiring resistance. Therefore, the delay time of the interconnection line given by the value (parasitic capacitance × parasitic resistance) is small, and operation can be carried out at high speeds. However, the presence of as many as five contact holes 21 in the memory of four bits makes it difficult to reduce the area of memory cells and, hence, makes it difficult to increase the degree of integration.

With the conventional structure shown in FIG. 3, on the other hand, gate electrodes of the transistors run in the horizontal direction to form word lines 5. Further, ground lines 6 and data lines 7 are formed by aluminum lines of the first layer running in the vertical direction. With the memory structure of FIG. 3, a thin oxide film is formed or not formed on a region 8 indicated by hatched lines to write information.

An insulator has been thickly formed (like in the isolation region) under the gate electrode (word line 15) in the right lower portion of FIG. 3, and information has been written already.

The structure of FIG. 3 has been disclosed in IEEE J. of SC "A 256 Kbit ROM with Serial ROM cell Structure", Roger Cuppens and L. H. M. Sevat, June, 1983, Vol. SC-18, No. 3.

In the memory cell shown in FIG. 3, the number of contact holes 22 is as small as three for the memory of four bits, and the memory cell area can be reduced compared with that of the structure of FIG. 2. However, since as many as three aluminum layers (one ground line and two data lines) are running in the vertical direction, a limitation is imposed on further reducing the area of the memory cells.

With the structure of FIG. 3, furthermore, the word lines are not straight and are long; i.e., the word lines have increased resistance and increased parasitic capacitance. Therefore, the structure of FIG. 3 is not advantageous for operating the ROM at high speed.

SUMMARY OF THE INVENTION

The object of the present invention is to provide memory cell structure for a ROM eliminating the abovementioned problems inherent in the conventional art.

Namely, the object of the present invention is to provide a ROM that is capable of operating at high speeds.

Another object of the present invention is to provide a ROM that can have a high degree of integration.

A further object of the present invention is to provide a ROM which maintains a high operation speed even when it is constructed in a highly densely integrated form.

In order to achieve the aobve-mentioned objects according to the present invention, a memory cell for a ROM satisfies any one or all of the following requirements:

(i) The word line is not folded but is laid out straight to minimize the length;

(ii) A metal line of the first layer, e.g., ground line composed of an aluminum line, is laid out in parallel with a word line; and (iii) A metal line of the second layer, e.g., a data line composed of an aluminum line, is laid out to intersect the word line at right angles therewith.

DETAILED DESCRIPTION OF THE INVENTION

The invention will be described below in detail by way of embodiments.

Figure 4:
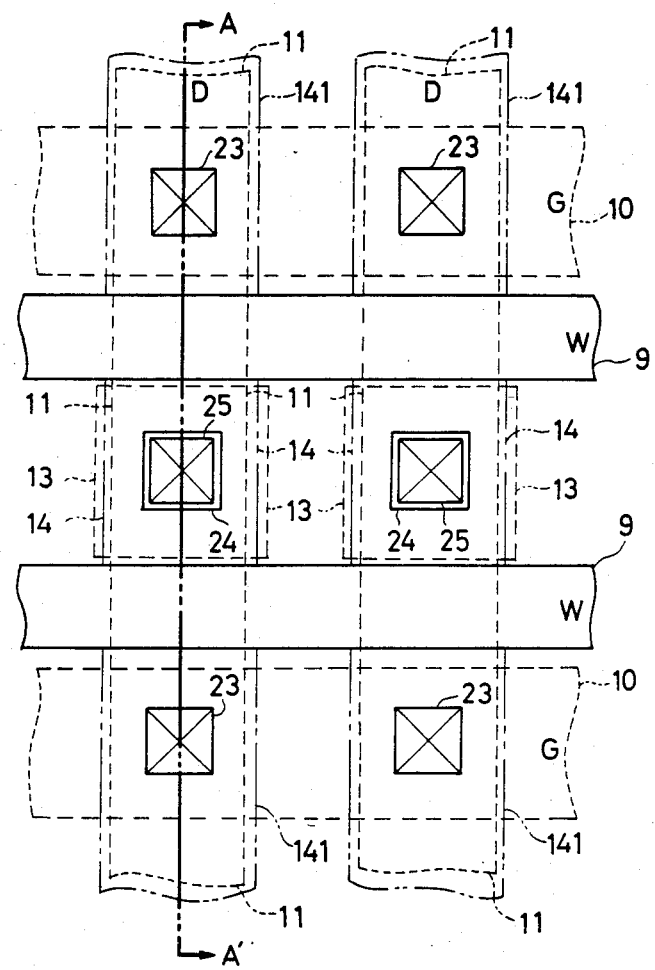
FIG. 4 is a plan view of a ROM according to the present invention.
Figure 5:
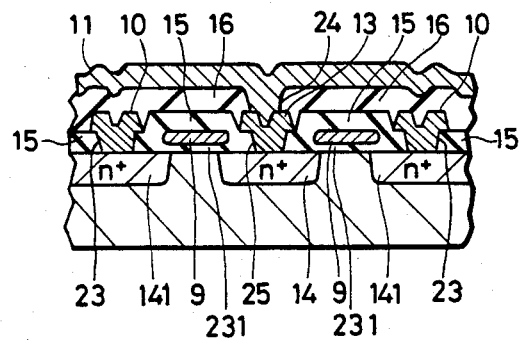
FIG. 5 is a section view of the ROM according to the present invention.

FIG. 4 is a plan view of a memory for four bits according to an embodiment of the present invention, and FIG. 5 is a section view along the line A—A' of FIG. 4.

Word lines 9 consisting of doped polycrystalline silicon or of a metal having a small resistance are linearly arranged in the horizontal direction. In parallel with the word lines 9, furthermore, ground lines 10 consisting of aluminum of the first layer are provided after every other gap formed by the word lines. The ground lines are connected via contact holes 23 to $n^+$-type diffusion layers 141 indicated by a dot-dash line in FIG. 4. The diffusion layer 141 serves as a source region of an MOS transistor constituting the memory cell. Further, a data line 11 indicated by a broken line in FIG. 4 is connected to a pad 13 consisting of aluminum of the first layer via a contact hole 24 formed in aluminum of the second layer.

Here, the pad 13 is not the one typically provided for general LSI's to make connection to the external unit, i.e., to effect the wire bonding. Instead, the pad 13 works to connect the data line 11 to the diffusion layer 14. The pad 13 is further connected to the $n^+$-type layer 14 at a portion of contact hole 25. The $n^+$-type diffusion layer 14 works as a common drain region for the two transistors that constitute memory cells, respectively. As shown in FIG. 5, furthermore, insulation films 15, 16 are interposed among the word lines, data lines and ground lines.

The insulation films 15, 16 may be composed of $SiO_2$ formed by thermally oxidizing a silicon substrate and/or polycrystalline silicon.

On the other hand, the insulation films 15, 16 may be composed of $SiO_2$ that is formed by the CVD (chemical vapor deposition) method or may be composed of other insulation films. It is convenient to form the insulation film 16 by the CVD method.

The insulation films 15, 16 obtained by the above-mentioned method are formed into desired shapes by the lithographic technique.

Information is written by forming the insulator 231 to be either thick or thin, depending on what information is to be written in to each memory cell.

Although FIGS. 4 and 5 illustrate only two word lines 9, word lines have further been arranged on the upper and lower sides of FIG. 4 to lay out MOS transistors that form memory cells. Therefore, the $n^+$-type diffusion layer 141 serves as a common source region for the MOS transistors.

Namely, the structure shown in FIG. 4 stretches toward the upper, lower, right and left directions continuously to constitute the ROM in a highly densely integrated form.

According to the present invention, the word lines 9 are not folded but run straight in the horizontal direction, so that the length thereof is minimized. Therefore, the word lines have reduced parasitic resistance and reduced parasitic capacitance (especially, parasitic capacitance between the silicon substrate and the word lines), and the ROM is allowed to operate at high speeds. The delay time of word lines can further be reduced greatly to realize a ROM that operates at very high speeds, if the word lines 9 are made of a metal having a small resistivity such as tungsten (W), molybdenum (Mo), titanium (Ti), tantalum (Ta), or a silicide of these metals, or if the word lines 9 are composed of such metals or silicides thereof formed on the polycrystalline silicon. The reason for this is that these materials have very small resistivities.

The ground lines 10 are composed of metal lines of the first layer such as aluminum (Al) lines or tungsten (W) lines that run in the horizontal direction in parallel with the word lines.

Figure 1:
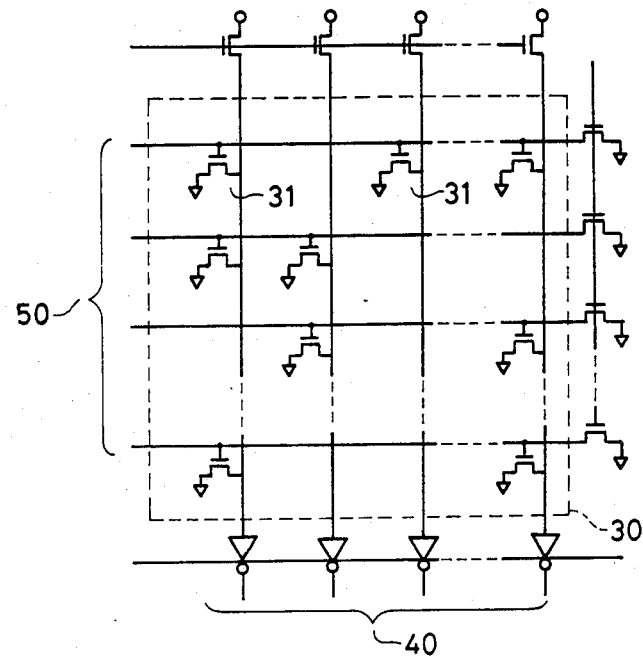
FIG. 1 is a circuit diagram of a conventional ROM.
Figure 2:
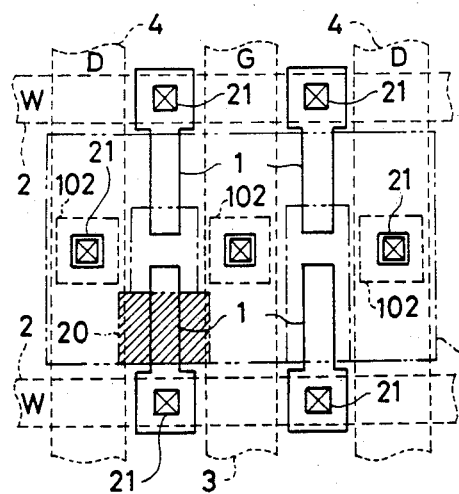
FIG. 2 is a plan view of a conventional ROM.
Figure 3:
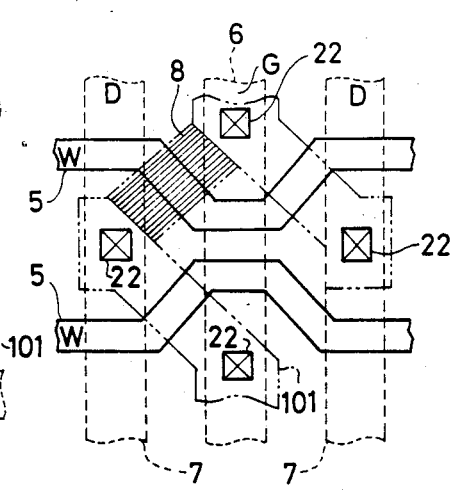
FIG. 3 is a plan view of another conventional ROM.

The structure of such ground lines is altogether different from the structures shown in FIGS. 2 and 3. As will be mentioned later, the number of metal lines running in the vertical direction of the memory cell is two, which is smaller than the three metal lines of FIG. 3. Therefore, the lateral size of the ROM cell is greatly reduced, making it possible to realize the ROM cell in a highly integrated form. In the ROM cells of the present invention, furthermore, the individual patterns intersect at right angles on a plane shown in FIG. 4, and the device can be designed in a minimum size determined by the processing technique. Therefore, the area of the ROM cell according to the present invention can be reduced compared with that of ROM cells of other structures prepared by the same process level, i.e., reduced to about one-half that of the structure of FIG. 2, and reduced to about one-fifth that of the structure of FIG. 3. In the ROM cell, furthermore, the area of drain diffusion layer of each transistor can be reduced compared with that of the structures shown in FIGS. 2 and 3, and junction capacitance of diffusion layer occupying about one-half the parasitic capacitance of the data line reduces, too, contributing to the increase in the operation speed.

FIG. 5 is a section view of the ROM cell of the present invention along the line A—A' of FIG. 4.

In the present invention, the second aluminum layer 11 which serves as the data line is connected to the diffusion layer 14 via the first aluminum layer. By forming the data line 11 using a metal line of the second layer, the insulation films 15, 16 under the data line 11 are allowed to have thicknesses greater than those of when the data line is composed of the metal line of the first layer. Therefore, the distance increases between the data line and the substrate or the word line, and parasitic capacitance of the data line decreases, contributing to the increase in the operation speed of the ROM cells.

Here, the data line 11 and the $n^+$-type diffusion layer 141 can be connected together without necessarily providing the pad 13 by using the the first aluminum layer. That is, the data line 11 consisting of aluminum line of the second layer may be directly connected to the $n^+$-type diffusion layer 141 by forming a contact hole that penetrates through the insulation films 15 and 16. Even in this case, parasitic capacitance of the data line can be decreased compared with the conventional structures. Here, the material for forming ground lines 10, data lines 11 and pads 13 needs not necessarily be limited to aluminum, as a matter of course.

Other examples of material which can be used include tungsten (W), molybdenum (Mo), and the like.

Figure 6:
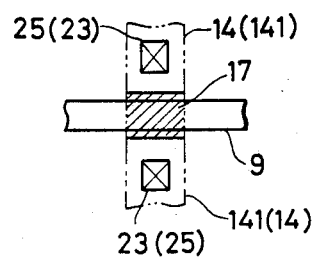
FIG. 6 is a plan view showing a pattern for writing information into the ROM of the present invention.

Memory information can be written into the ROM cell of the present invention by thickly or thinly forming an oxide film 231 under the word line 9 by using a mask pattern 17 in the hatched portion as shown in FIG. 6, i.e., by changing the threshold voltage of the MOS transistor.

Figure 7:
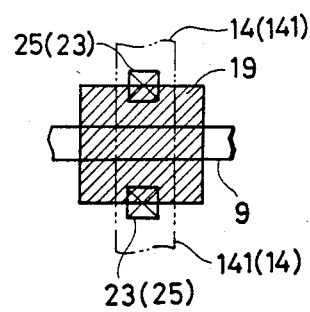
FIG. 7 is a plan view showing another pattern for writing information into the ROM of the present invention.

As shown in FIG. 7, furthermore, memory information can also be written by implanting impurities using a mask pattern 19 in the hatched portion.

In either case, what is important is that the change of threshold voltage should help determine the presence or absence of information.

Figure 8:
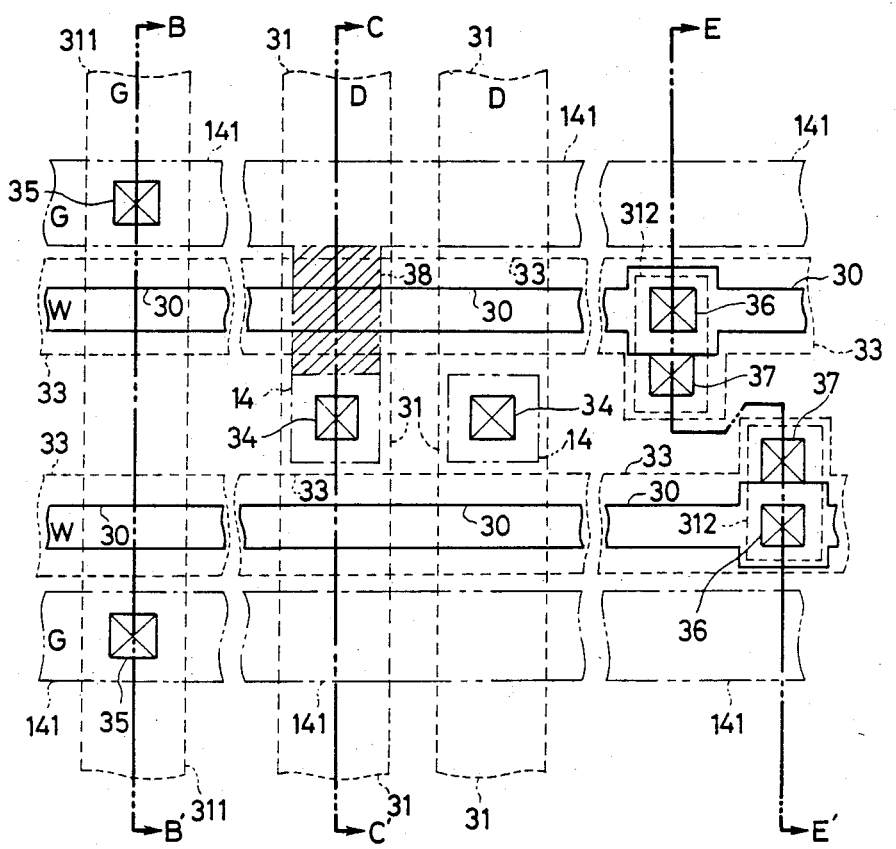
FIG. 8 is a plan view of the ROM according to another embodiment of the present invention.
Figure 9:
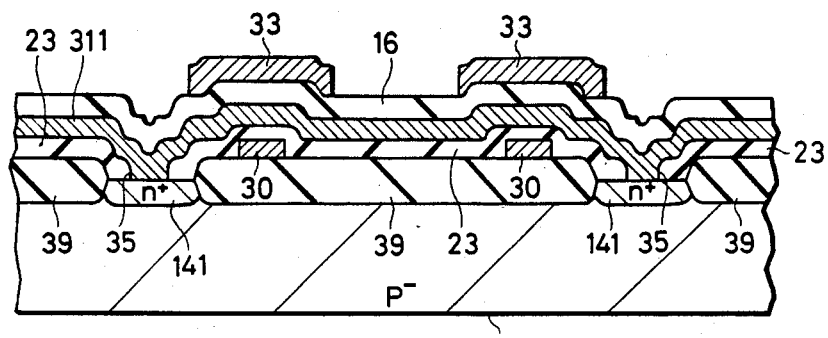
FIG. 9 is a section view along the line B—B' of FIG. 8.
Figure 10:
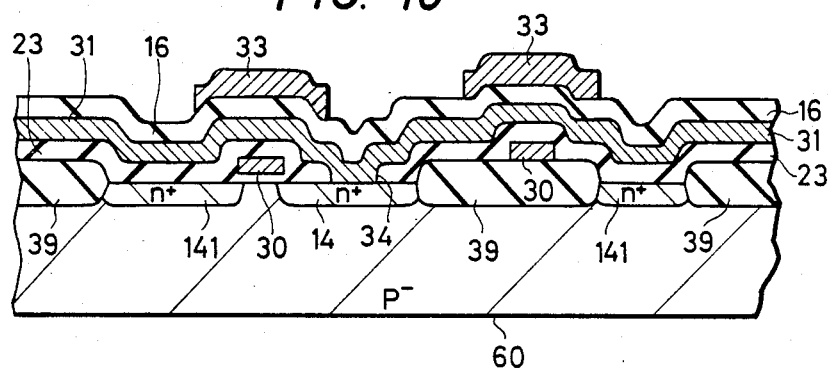
FIG. 10 is a section view along the line C—C' of FIG. 8.
Figure 11:
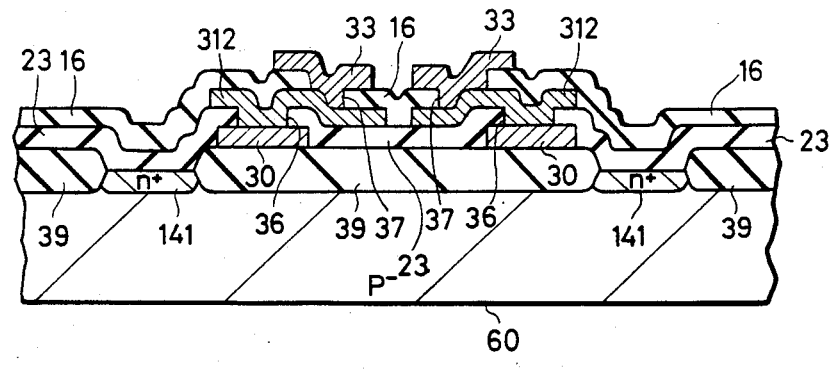
FIG. 11 is a section view along the line E—E' of FIG. 8.

FIG. 8 is a plan view of a memory for four bits according to a second embodiment of the present invention, and FIGS. 9, 10 and 11 are section views along the line B—B', line C—C' and line E—E' thereof, respectively.

In FIG. 8, reference numeral 30 denotes electrically conductive layers which consist of polycrystalline silicon, a silicide, or any other metal, and which form word lines, 31 denotes electrically conductive layers which consist of aluminum or any other metal and which form data lines, 311 denotes electrically conductive layers which consist of the same layers as the layers 31 and which form ground lines, 312 denotes intermediate layers that connect the word lines 30 to metal lines 33 which exist above thereof via contact holes 36 and 37, 141 denotes diffusion layers that form ground lines, the diffusion layers 141 being connected to the metal ground lines 311 via contact holes 35, and 14 denotes diffusion layers that serve as source or drain regions and that are connected to data lines 31 via contact holes 34.

This embodiment is different from the first embodiment with regard to the below-mentioned points. .

(1) In the first embodiment, the ground lines consist of metal lines 10 of the first layer running in the horizontal direction. In the second embodiment, ground lines of memory cells of a given number of bits are composed of diffusion layers 141, and are connected, via contact holes 35, to metal lines 31 of the first layer running in the vertical direction at ends (portions B—B' in FIG. 8) of memory cells of a given number of bits.

(2) In the first embodiment, the data lines are composed of metal lines 11 of the second layer. In the second embodiment, the data lines are composed of metal lines 31 of the first layer connected, via contact holes 34, to the diffusion layers 14. Further, metal lines 31, 311 form data lines D and ground lines G.

(3) In the first embodiment, the word lines consist of single layers 9 for gate electrodes, that are composed of polycrystalline silicon or tungsten, and that run in the horizontal direction in FIG. 4. In the second embodiment, the word lines have double-layer structure consisting of word lines 30 and metal lines 33 composed of aluminum of the second layer running in parallel with the word lines 30. Like the above-mentioned ground lines, the gate electrodes 30 and the metal line 33 of the second layer are connected together via contact holes 36, 37 at the ends of memory cells of a given number of bits, such that resistance of the word lines decreases.

The thus constructed embodiment has features as described below. First, the contact holes 34, 35 and 36 under the metal lines of the first layer are formed to be separated away from the contact holes 37 under the metal lines of the second layer on a plane. This presents an advantage in the manufacturing process with regard to applying a coating to the metal films in the portions of contact holes. In the first embodiment, the two contact holes 24, 25 are superposed on the same place. Therefore, a large step exists in the portions of contact holes, and a difficulty exists in regard to forming the metal film. As described already, however, the layout of contact holes of the first embodiment provides an advantage with regard to increasing the integration density. A second feature of the embodiment is that the word lines are short-circuited by metal lines 33 made of aluminum or tungsten or molybdenum having very small resistivity, thereby presenting an advantage with regard to carrying out the operation at high speeds. As shown in the portion C—C' of FIG. 8, however, an additional area is required to connect the gate electrode 30 to the metal line 33 of the second layer, presenting slight disadvantage from the standpoint of integration density compared with the first embodiment.

In the second embodiment as described above, the data lines and the word lines are formed straight, and intersect at right angles with each other based upon the fundamental idea mentioned in the first embodiment. The second embodiment offers improvements with regard to high-speed operation and the manufacturing process, but slightly sacrifices the integration density. Even in this embodiment, memory information is written onto the ROM cells in the same manner as the first embodiment. In FIG. 8, the thickness of the oxide film is reduced under the word line 30 using a mask pattern in the hatched portion 38, and the threshold voltage of the MOS transistor is decreased to write memory information. The fundamental idea of the present invention can also be maintained even if the metal lines of the first layer and the metal lines of the second layer are used in a reversed manner in the second embodiment. The resistance of diffusion layers 141 which form ground lines can be reduced further by forming silicides of W, Mo, Ti, Ta etc or refractory metals such as W, Mo etc on diffusion layers.

As described above, the present invention makes it possible to realize highly integrated memory cells for a ROM requiring an area which is reduced by one-half to one-fifth of that of the conventional structures. According to the present invention, furthermore, parasitic resistance and parasitic capacitance of the word lines and data lines can be decreased, enabling the ROM to operate at high speeds.

Here, the invention is in no way limited to the aforementioned embodiments only, but can be modified in a variety of ways without departing from the spirit and scope of the invention. For instance, the memory cells for the ROM of the present invention may be made up of either n-channel MOS transistors or p-channel MOS transistors using silicon semiconductor material. Compound semiconductors can also be used such as SOS (silicon on sapphire), SOI (silicon on insulation), GaAs, and the like. Further, although the foregoing description has dealt with the case in which the invention was adapted to the ROM, structure according to the invention can also be adapted to a programmable logic (PLA).

What is claimed is:

1. A read-only memory comprising a plurality of insulated gate field effect transistors, a plurality of word lines, a plurality of data lines, and a plurality of memory cells disposed at respective intersections of the word lines and the data lines, wherein:

said word lines are formed straight on a semiconductor substrate and operate as gate electrodes of said insulated gate field effect transistors formed in said memory cells;

first conductive lines are provided over said word lines through an insulator and are electrically connected to said word lines at least at two points;

first impurity regions are provided in said semiconductor substrate and operate as one of a drain or source of said insulated gate field effect transistors, said first impurity regions being formed in parallel with said word lines;

second impurity regions are provided in said semiconductor substrate and operate as the other of said source or drain of said insulated gate field effect transistors;

second conductive lines are connected to said first impurity regions; and third conductive lines are connected to said second impurity regions;

and further wherein:

said second conductive lines operate as ground lines and are arranged so that each of said first impurity regions is coupled to one of said ground lines through a contact hole in an insulator formed over each of said first impurity region;

said third conductive lines operates as data lines; and information is read out from said cells selected by said word lines and said data lines.

2. A read-only memory according to claim 1, wherein said second conductive lines and said third conductive lines are formed simultaneously by the same process.

3. A read-only memory according to claim 1, wherein said word lines and said first conductive lines are connected together via fourth conductive lines that are formed by the same process as that forming said second metal lines and said third metal lines.

4. A read-only memory according to claim 1, wherein said ground lines are laid out between predetermined pairs of said word lines.

5. A read-only memory according to claim 4, wherein said second impurity layers serve as drains of MOS transistors constituting memory cells and said first impurity layers serve as sources of said MOS transistors, said first and second impurity layers being formed alternatingly on a surface region of said semiconductor layer in a gap formed by said word lines, and further wherein said data lines are connected to said second impurity layers, and said ground lines are connected to said first impurity layers.

6. A read-only memory according to claim 5, wherein said second impurity layers and said data lines are connected together via pads comprised of the first conductive lines.

7. A read-only memory according to claim 5, wherein said second impurity layers and said data lines are connected together directly.

8. A read-only memory according to claim 1, wherein said first conductive lines are parallel to said word lines.

9. A read-only memory according to claim 1, wherein said second conductive lines are perpendicular to said first impurity regions and are parallel to said third conductive lines.

10. A read-only memory according to claim 8, wherein said second conductive lines are perpendicular to said first impurity regions and are parallel to said third conductive lines.

11. A read-only memory according to claim 4, wherein said data lines are perpendicular to said word lines and ground lines.

12. A read-only memory according to claim 1, wherein said first, second and third conductive lines are formed of metal.

* * * * *